United States Patent [19]

Sturgill et al.

[11] Patent Number: 5,713,178
[45] Date of Patent: Feb. 3, 1998

[54] ELECTROMAGNETIC INTERFERENCE RESISTANT ENCLOSURE PANEL AND METHOD OF MAKING [THE SAME]

[75] Inventors: W. Jeffrey Sturgill, Marion; Paul Case, Glade Spring; Donald Stanulis, Marion; Robert S. Maule, Sollville; Richard A. Bamberg, Chilhowie, all of Va.

[73] Assignee: Marion Composites, A Div. of Technical Products Group, Inc., Marion, Va.

[21] Appl. No.: 673,148

[22] Filed: Jul. 1, 1996

[51] Int. Cl.⁶ .................. E04C 2/08; E04C 2/26; E04C 2/292; E04C 2/38
[52] U.S. Cl. .......... 52/794.1; 52/479; 52/481.1; 52/483.1; 52/783.18; 52/789.1; 52/798.1; 52/800.1; 52/801.1; 52/745.05; 52/745.19
[58] Field of Search .............. 52/800.1, 801.1, 52/783.18, 789.1, 794.1, 798.1, 479, 481.1, 483.1, 745.19, 745.05; 156/257, 209, 153

[56] References Cited

U.S. PATENT DOCUMENTS

| | | | |
|---|---|---|---|
| 3,286,412 | 11/1966 | Greig et al. | 52/479 X |
| 4,748,789 | 6/1988 | Hedley | 52/798.1 X |

*Primary Examiner*—Christopher Kent
*Attorney, Agent, or Firm*—Wood, Phillips, VanSanten, Clark & Mortimer

[57] ABSTRACT

Electromagnetic interference across a structural panel is minimized in a construction wherein a metal skin (24) is bonded to a metal frame (22) by an adhesive (40) by providing a series of peaks (36) and valleys (38) at the area of the intended joint between the skin (24) and the frame (22). The peaks (36) penetrate through the adhesive (40) to establish substantial electrical contact between the skin (24) and the frame (22) to provide shielding against electromagnetic interference while the adhesive (40) bonds the two together to provide a structurally sound panel.

12 Claims, 2 Drawing Sheets

ELECTROMAGNETIC INTERFERENCE RESISTANT ENCLOSURE PANEL AND METHOD OF MAKING [THE SAME]

FIELD OF THE INVENTION

This invention relates to building panels, and more particularly, to building panels that are electromagnetic interference resistant.

BACKGROUND OF THE INVENTION

The proliferation of sensitive electronic equipment has accentuated the problem of electromagnetic interference. In some cases, electronic equipment is subject to malfunction when exposed to any appreciable electromagnetic interference. In others, as in military applications, electromagnetic signals generated by operation of the equipment itself can be used to pinpoint the location whereat such equipment is housed.

The problems becomes particularly acute where the electronic equipment is to be housed in structures that are not intended to be permanent structures in the strictest sense of the word. For example, relocatable and rapidly erectable temporary structures or enclosures may be employed by the military to house the electronic equipment because of their ability to be deployed rapidly at any desired sight as may be required in the course of a military operation. In the case of such enclosures, because mobility and speed of deployment is all important, it is not feasible to provide the means for preventing the radiation of electromagnetic interference in the same way as that might be attended to in a far more permanent installation.

Not untypically, such relocatable and rapidly erectable enclosures are made up of a series of panels, which are each generally self-supporting and which are fastened together to define a structure. In the usual case, each panel includes a polygonal frame sandwiched by two skins. The frame and the skins are typically metal and a low density core is disposed within the frame and between the skins. Metallic and non-metallic honeycomb, rigid foams and balsa are typical core materials.

The skins are bonded to the frame by means of an adhesive and in many instances, a thermal barrier is interposed between one of the skins and the frame to minimize thermal transfer.

These panels work well in terms of providing durable, relocatable and rapidly erectable structures. However, because the skins are bonded by an adhesive to the frame, creating electrical isolation through which unintended radio frequency emissions from sensitive electronic equipment contained within an enclosure formed of such panels may escape detection of the equipment is allowed. Alternatively, electromagnetic interference may enter the structure and interfere with the operation of equipment contained therein.

The present invention is directed to overcoming one or more of the above problems.

SUMMARY OF THE INVENTION

It is the principal object of the invention to provide an electromagnetic interference resistant enclosure panel. It is also an object of the invention to provide a method of increasing the electromagnetic interference shielding across the joint of adhesively joined metallic members.

According to the invention there is provided an electromagnetic interference resistant structure that includes a metal frame and a metal skin having an interface with the frame. A series of peaks and valleys are located on either or both of the frame and the skin at the interface. The peaks are in intimate or near intimate contact with the other of the frame and the skin while adhesive is located in the valleys to bond the panel to the frame.

In a highly preferred embodiment, the peaks are in substantial electrical contact with the other of the frame and the skin to minimize electrical resistance between the two to thereby provide a barrier or shield against electromagnetic interference.

The method contemplated by the invention includes the steps of forming a series of peaks and valleys on one of two metal members to be adhesively joined at an interface. The peaks and valleys are located at the intended location of the joint. Thereafter, an adhesive is placed at the intended location of the joint and the members are brought into substantial abutment at the intended location of the joint. The members are then pressed together to bring the peaks on the one member into intimate or near intimate contact with the other member while causing the adhesive to extend between the two members to bond the same together.

The metal employed is preferably aluminum or steel. The adhesive employed is preferably an epoxy resin.

Typically, the frame is in the form of a polygon and made of tubular material or the like. The frame is sandwiched by two metal skins as is a core which may typically be formed of foam or honeycomb. A thermal barrier may be interposed between one of the skins and the frame.

Other objects and advantages will become apparent from the following specification taken in connection with the accompanying drawings.

DESCRIPTION OF THE PREFERRED EMBODIMENT

Figure 1:
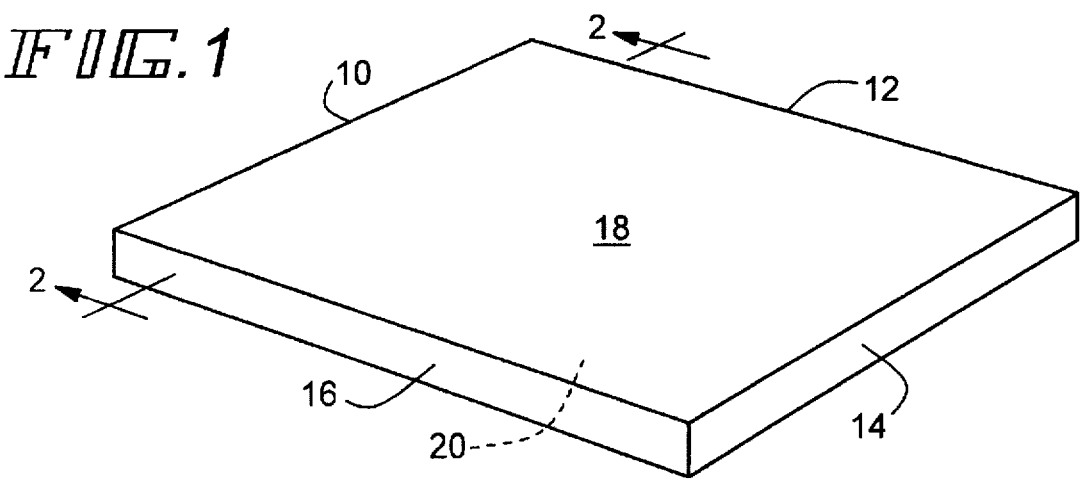
FIG. 1 is a perspective view of an enclosure panel made according to the invention.

An exemplary embodiment of an enclosure panel made according to the invention is illustrated in the drawings and with reference to FIG. 1 is seen to be generally polygonal in shape having sides 10, 12, 14 and 16 as well as a top 18 and a bottom 20. Typically, each panel will be self-supporting such that a plurality of the panels can be secured together in any conventional way to define an enclosure which may house, for example, electrical equipment capable of generating electromagnetic emissions or susceptible to being affected by the presence of electromagnetic interference.

Figure 2:
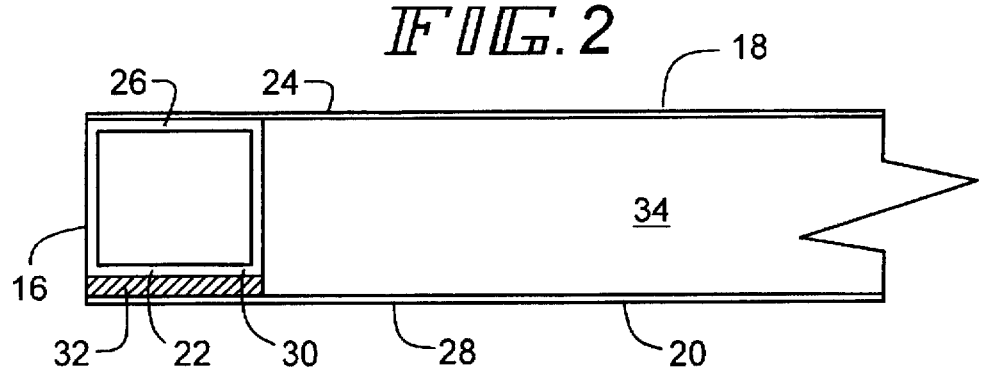
FIG. 2 is an enlarged, fragmentary, sectional view of the panel taken approximately along the line 2—2 in FIG. 1.

As seen in FIG. 2, each panel includes a tubular, peripheral frame 22. As illustrated, the tubular frame 22 is a rectangular tube but other shapes could be used if desired. Channels (not shown) could also be employed. The upper side 18 is defined by a skin 24 adhered to one side wall 26 of the frame 22 while the bottom 20 of the panel is defined by a similar skin 28 which is adhered to a bottom side 30 of the frame 22 with a thermal barrier 32. The thermal barrier 32 may be formed of any material that is a poor heat conductor. Typically, a reinforced plastic or wood is used for the purpose. Within the confines of the frame 22 and between the skins 24 and 28, a core 34 is located. Preferably, the core 34 is either a rigid foamed material or a non-metallic honeycomb as is well known.

In the usual case, both the frame 22 and the skins 24 and 28 will be made of the same metallic material. Typically, aluminum or steel will be used for the purpose.

Figure 3:
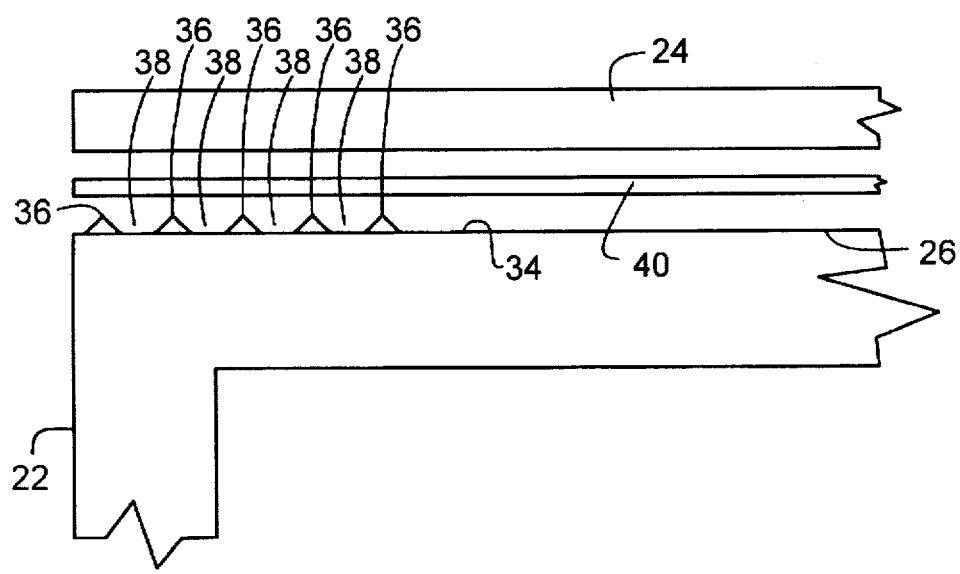
FIG. 3 is a further enlarged, fragmentary, expanded view of part of the panel.

According to the invention, at the location whereat the skin 24 is to be adhered to the frame 22, the surface of one or both of such elements, preferably a surface 34 on the side 26 of the frame 22, is roughened as with a knurling tool to provide a series of peaks 36 and interposed valleys 38. An adhesive layer 40, preferably an epoxy resin adhesive, is interposed between the frame and the skin 24 as illustrated in FIG. 3.

Figure 4:
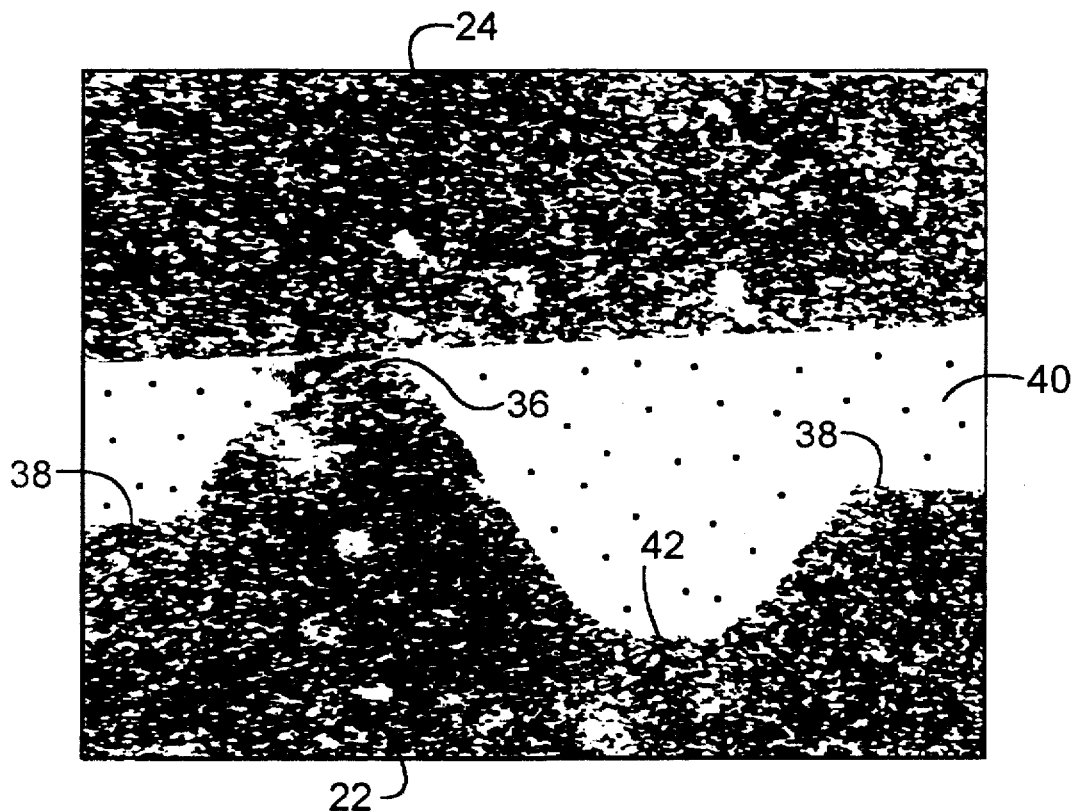
FIG. 4 is a photo micrograph of part of a joint between a frame used in the panel and a skin secured to the frame, magnified 120 times.

Turning now to FIG. 4, which is a photo micrograph of the joint between the skin 24 and the frame 22 where the frame 22 has been roughened and magnified 120 times, it will be seen that a peak 36 is in intimate or near intimate, that is, in substantial electrical contacting engagement, with the skin 24. Because of the way in which the peaks 36 are formed, there may not be actual contact along their entire length but in view of measured reduction in the resistance between the skin 24 and the frame 22, it is believed that each peak 36, at least in part, is in electrical contact with the adjacent skin 24.

The valleys 38 on either side of the peak 36 contain adhesive 40 which then serves to accomplish the bonding between the frame 22 and the skin 24.

Figure 5:
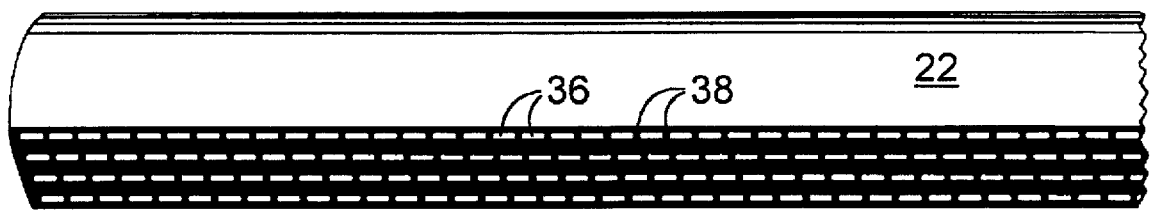
FIG. 5 is a perspective view of part of the panel frame.

As seen in FIG. 5, the peaks 36 may be located in rows. The rows are separated by about 0.1 inches by valleys 38 and the individual peaks 36 in each row are likewise separated by a valley 38. Approximately 6 or 7 peaks per inch are provided in each row. Of course, these dimensions may be widely varied, dependant upon the frequencies involved and the attenuation desired. The height of the peaks 36 above the surface 34 is in the range 0.006–0.010 inches. Too short of a height will not provide sufficient attenuation while too great of a height can result in a weakened joint.

Returning to FIG. 4, it will be seen that immediately adjacent one side of the peak 36, the valley 38 has a deep furrow 42. The peaks 36 are formed not by stamping with a knurling wheel, but rather, by literally "plowing" the surface 34 of the frame 22 that is to be roughened. That is to say, part of the material of the surface is actually literally moved to one side creating the furrow 42 as well as the adjacent peak 36. This can be accomplished by placing the knurling wheel at a 10°–15° angle to the direction in which it is moved relative to the frame 22 much as a farmer discing a field has the rotational axis of the disc at a non-90° angle to the direction of movement of the disc through the field.

As presently understood, it is preferred to form a sufficient number of the peaks 36 so that there is a density of about 60 peaks per square inch of the surface 34. However, other densities may be employed dependent upon row spacing, etc.

The panels may be assembled using either vacuum bag curing, in which case, the pressure applied to the skins 24 and 28 pressing them toward the frame 22 will be on the order of 15 psi. More preferably, the components are bonded together in a heated press at a pressure in the range of 20–35 psi and a temperature in the range of 270°–290° F. Press residence time will be typically in the range of 35–60 minutes.

Those skilled in the art will recognize that the temperature and pressures may vary to some extent depending upon the specific adhesive employed. Those given above are for an epoxy structural film meeting the standards of ASTM E865.

The resulting panel has a significant decrease in the resistance between the skin 24 and the frame 22 to provide a substantial shield to electromagnetic interference across the overall panel. As a consequence, the panels are ideally suited for structural use where such electromagnetic interference resistance is required in housing electronic equipment.

What is claimed is:

1. An electromagnetic interference resistant enclosure panel comprising:
    a metallic frame of sufficient strength to provide a generally self-supporting panel;
    a metallic skin; and
    adhesive adhering said skin to said frame to form a frame/skin joint;
    one of said skin and said frame being roughened at said frame/skin joint to provide a plurality of peaks and valleys to which said adhesive adheres with the peaks being such as to extend through the adhesive into substantial electrical contact with the other of said skin and said frame to minimize electrical resistance across the frame/skin joint.

2. The electromagnetic interference resistant enclosure panel of claim 1 wherein said frame is roughened.

3. The electromagnetic interference resistant enclosure panel of claim 1 wherein said frame and said skin are aluminum or steel.

4. An electromagnetic interference resistant enclosure panel comprising:
    a polygonal frame formed of metal;
    spaced, generally parallel metallic skins sandwiching said frame;
    a low density core contained within said frame and between said skins;
    a thermal barrier disposed between one of said skins and said frame;
    a series of peaks and valleys at an interface of the other of said skins and said frame;
    said peaks generally establishing electrical contact between said other skin and said frame; and
    adhesive in said valleys adhering said other skin and said frame together.

5. The electromagnetic interference resistant enclosure panel of claim 4 wherein said frame is formed of tubing having opposed flattened sides, said peaks and valleys being located in one or both of said sides.

6. The electromagnetic interference shielded enclosure panel of claim 5 wherein said adhesive is an epoxy.

7. An electromagnetic interference resistant structure comprising:
    a metal frame;
    a metal skin having an interface with said frame;
    a series of peaks and valleys on one of said frame and said skin at said interface, said peaks being in intimate or near intimate contact with the other of said frame and said skin; and
    adhesive in said valleys bonding said skin to said frame.

8. A method of increasing electromagnetic interference shielding across a joint of adhesively joined metal members comprising the steps of:
    a) forming a series of peaks and valleys on one of the members at an intended location of the joint;

b) placing an adhesive at the intended location of the joint;

c) bringing the members into substantial abutment at the intended location of the joint; and d) pressing the members together to bring the peaks on said one member into intimate or near intimate contact with the other member while causing the adhesive to bond the members together.

9. The method of claim 8 wherein step a) is performed by mechanically forming the peaks with a tool.

10. The method of claim 8 wherein step d) includes the application of heat to the intended joint.

11. The method of claim 10 wherein one of said members is an aluminum frame and the other of the members is an aluminum skin and said adhesive is an epoxy resin.

12. The method of claim 10 wherein one of said members is a steel frame and the other of the members is a steel skin and said adhesive is an epoxy resin.

\* \* \* \* \*